United States Patent
Papenbreer

(10) Patent No.: US 7,439,869 B2
(45) Date of Patent: Oct. 21, 2008

(54) INDICATING DEVICE, CIRCUIT ARRANGEMENT AND METHOD FOR INDICATING THE STATUS OF ONE OF A PLURALITY OF SWITCHES CONNECTED IN SERIES TO A SAFETY RELAY

(75) Inventor: Rudolf L. Papenbreer, Wuppertal (DE)

(73) Assignee: Rockwell Automation Germany GmbH & Co. KG, Wuppertal (DE)

( * ) Notice: Subject to any disclaimer, the term of this patent is extended or adjusted under 35 U.S.C. 154(b) by 257 days.

(21) Appl. No.: 11/244,528

(22) Filed: Oct. 6, 2005

(65) Prior Publication Data

US 2006/0209488 A1  Sep. 21, 2006

(30) Foreign Application Priority Data

Mar. 16, 2005  (EP) ................................. 05005777

(51) Int. Cl.
G08B 21/00 (2006.01)
(52) U.S. Cl. ........................ 340/644; 340/657; 324/66
(58) Field of Classification Search ................. 340/644, 340/513, 593, 508, 510, 657; 324/66
See application file for complete search history.

(56) References Cited

U.S. PATENT DOCUMENTS

| | | | |
|---|---|---|---|
| 3,518,655 A | 6/1970 | Saul | 340/274 |
| 4,209,666 A | 6/1980 | Lawton | 370/13 |
| 4,274,087 A | 6/1981 | Swanson et al. | 340/525 |
| 4,435,700 A | 3/1984 | Alley | 340/539 |
| 4,567,471 A * | 1/1986 | Acar | 340/513 |
| 4,616,216 A * | 10/1986 | Meirow et al. | 340/644 |
| 4,761,762 A * | 8/1988 | Holmes | 710/260 |
| 6,215,204 B1 | 4/2001 | Brown et al. | 307/326 |
| 7,151,432 B2 * | 12/2006 | Tierling | 340/2.28 |
| 2002/0175568 A1 | 11/2002 | Clement et al. | |
| 2003/0011250 A1 | 1/2003 | Pullmann et al. | |
| 2003/0038017 A1 * | 2/2003 | Boyer et al. | 200/1 R |
| 2003/0058623 A1 | 3/2003 | Veil et al. | |

* cited by examiner

*Primary Examiner*—Phung T. Nguyen
(74) *Attorney, Agent, or Firm*—Quarles & Brady LLP; William R. Walburn

(57) ABSTRACT

A circuit arrangement for indicating the status of one of a plurality of switches connected in series between signal terminals of a safety relay, each switch actuable between an open position and a closed position. The circuit arrangement includes at least one voltage sensor configured to be connected to one of the plurality of switches to provide an output signal upon sensing a presence of a voltage across the one of the plurality of switches and an indicating means associated with the voltage sensor to provide an indication signal when the voltage sensor provides an output signal. The circuit arrangement is powered by the voltage provided at one of said signal terminals of the safety relay.

22 Claims, 2 Drawing Sheets

INDICATING DEVICE, CIRCUIT ARRANGEMENT AND METHOD FOR INDICATING THE STATUS OF ONE OF A PLURALITY OF SWITCHES CONNECTED IN SERIES TO A SAFETY RELAY

CROSS-REFERENCE TO RELATED APPLICATIONS

This application claims the benefit of European Patent Application No. 05 005 777.7 filed Mar. 16, 2005, and entitled "Indicating Device, Circuit Arrangement And Method For Indicating The Status Of One Of A Plurality Of Switches Connected In Series To A Safety Relay."

BACKGROUND OF THE INVENTION

The invention relates generally to means for indicating the status of one of a plurality of switches which are connected in series and, more particularly, to an indicating device, a circuit arrangement, and method for indicating the status of one of a plurality of safety switches which are connected in series between standard signal terminals of a safety relay.

Safety relays are apparatuses intended to ensure the safety of humans working in the environment of an industrial process. Safety relays are used, for example, to detect the opening of emergency stop switches or other machine lockout switches such as interlock switches guarding a gate or limit switches.

Safety relays and safety devices such as the above-mentioned switches have to be designed to meet stringent requirements defined in worldwide adopted safety standards. These standards intend to achieve high reliability. High reliability is achieved particularly by applying redundancy, diversity, and monitoring principles. In this context reference is made, for example, to a publication of Rockwell Automation: "SAFETY-BR001B-EN-P", April 2002, pages, 10 to 13.

Safety relays provide, for example, internal checking of fault conditions such as jammed, welded, or stuck contacts of safety switches. Moreover, safety switches such as limit switches, which already have redundant normally closed safety contacts for use with dual-channel safety relays, are additionally provided with an auxiliary contact for status indication.

Safety relays offer the possibility to connect two or more safety switches in series with an input of a safety relay. When checking the proper operation of the switches it is, for example, in the case of welded contacts of one of the switches, difficult to find out which one of the serially connected switches failed to open. There is the possibility to visually inspect each one of the switches. However, this is cumbersome and time consuming. Another possibility is to provide each one of the switches with auxiliary contacts for status inspection. However, this is rather expensive and requires additional wiring.

SUMMARY OF THE INVENTION

The present invention overcomes the aforementioned drawbacks by providing an indication of the status of one of a plurality of switches which are connected in series between signal terminals of a safety relay, wherein each switch has an open position and a closed position and can be actuated by an actuating means, such as a button, cable, key, or the like, to bring the switch from either the open position or closed position into the other position.

According to one aspect of the invention, an indicating device is disclosed. The indicating device includes a field device having a first plurality of terminals for connection to standard signal terminals of the safety relay, a second plurality of terminals for connection to one of the switches, and an electronic voltage sensing and indicating circuit. The first plurality of terminals, the second plurality of terminals, and the electronic circuit are electrically connected to one another within the field device and the electronic circuit is designed to be powered by a voltage that is provided at predetermined ones of the first plurality of terminals. Accordingly, the voltage is the same voltage that is applied to the connected switches, which are serially connected. As such, the indicating device does not need any additional supply lines to provide the device with electric energy and that there is no need to modify the relay module.

According to another aspect of the invention, a circuit arrangement includes at least one voltage sensor and an indicating means associated with the voltage sensor. The voltage sensor is connectable to one of the switches for providing an output signal when the presence of a voltage is sensed across the switch. The indicating means provides an indication signal when the voltage sensor provides an output signal. In accordance with this aspect of the invention, the circuit arrangement is powered by a voltage that is conventionally provided at predetermined ones of the signal terminals as a voltage signal supplied from the safety relay to the switches. Hence, any separate external voltage supply for the circuit arrangement is avoided.

In this regard, there is no need to provide additional contacts for status indication or apply test signals to the switches. The indication is generated by the unmodified switch itself. The circuit arrangement is connected across the switch and to the voltage provided at the predetermined signal terminals. As these terminals are components of the safety relay there is no need to provide additional wiring for powering the circuit arrangement, or any need for changes in the relay module.

In addition, in case of a dual-channel safety relay type, which provides both poles of a signal voltage at a first and a second signal terminal of the safety relay, and as the plurality of switches are connected in a daisy chain to the first and second signal terminals, which are signal output terminals of the safety relay, it is possible to implement powering of the circuit arrangement at any location of the daisy chain.

Hence, the voltage applied to the circuit arrangement may be provided by direct connection to the commonly provided predetermined signal terminals and/or by connection to the series connection of the switches. In other words, one can use cost attractive daisy chain connections together with standard safety relays for powering the circuit arrangement.

This circuit arrangement does not need a separate external power supply and, thus, can be readily used in field devices. The indicating signal, independent of whether it is supplied to a light emitting diode (LED) or any other indicating or display means, is generated only by the respective switch with the help of an electronic circuit which is powered via the same terminals of the safety relay module to which the serially connected switches are connected.

Series or daisy chain connections are a convenient and cost effective way to monitor a plurality of safety switches by a single or individual monitoring signal. In addition, this configuration achieves a high degree of reliability in so far as it provides a highly reliable electronic circuit arrangement for testing the correct operation of the switches. This may offer the possibility of using safety relays of a lower safety category without lowered safety standards.

The voltage sensors can be implemented using simple and inexpensive electronic parts or components such as logic gates. For example, the voltage sensors can be implemented using comparators in the form of EXCLUSIVE OR gates.

Also, the indicating means can be implemented using LED's that are controlled by the output signals of the EXCLUSIVE OR gates, for example, by way of a driver transistor.

The switches may be emergency stop switches and, conventionally, the switches may have two sets of normally closed contacts that are mechanically linked for dual-channel operation of the safety relay.

The circuit arrangement may be contained in a module or similar containment that has terminals for connection to the individual switches and to the safety relay terminals. This provides a central indication means for distributed switches.

The circuit arrangement, for example, can determine whether the contacts of each one or a selected one of the plurality of switches will open upon actuation of the respective switch into the open position. Vice versa, the circuit arrangement offers the possibility to determine whether or not a switch will close upon actuation into the closed position.

The circuit arrangement can be applied to switches that are actuable to bring them into each one of both positions, however, particularly to normally closed switches that are actuable to bring them into the open position.

Therefore, the present invention provides an electronic circuit arrangement for indicating the status of each one or a selected one of a plurality of safety switches that are connected in series with an input of a safety relay, where each switch can be actuated by an actuator to bring the switch from a closed position into an open position.

The present invention also provides a method for indicating a switch status. According to one embodiment of the invention, the method includes the steps of connecting a circuit arrangement for sensing and indicating a voltage that is provided at predetermined ones of said signal terminals of the safety relay; bringing each one of said plurality of switches into the closed position; actuating one of said plurality of closed switches to bring it from the closed position into the open position, while retaining the remaining switches in the closed position; sensing whether or not a voltage is present across the actuated switch by means of said circuit arrangement; and providing an indication signal upon sensing the presence of a voltage to indicate that the actuated switch has been duly brought into the open position by said actuation.

DETAILED DESCRIPTION OF A PREFERRED EMBODIMENT

Figure 1:
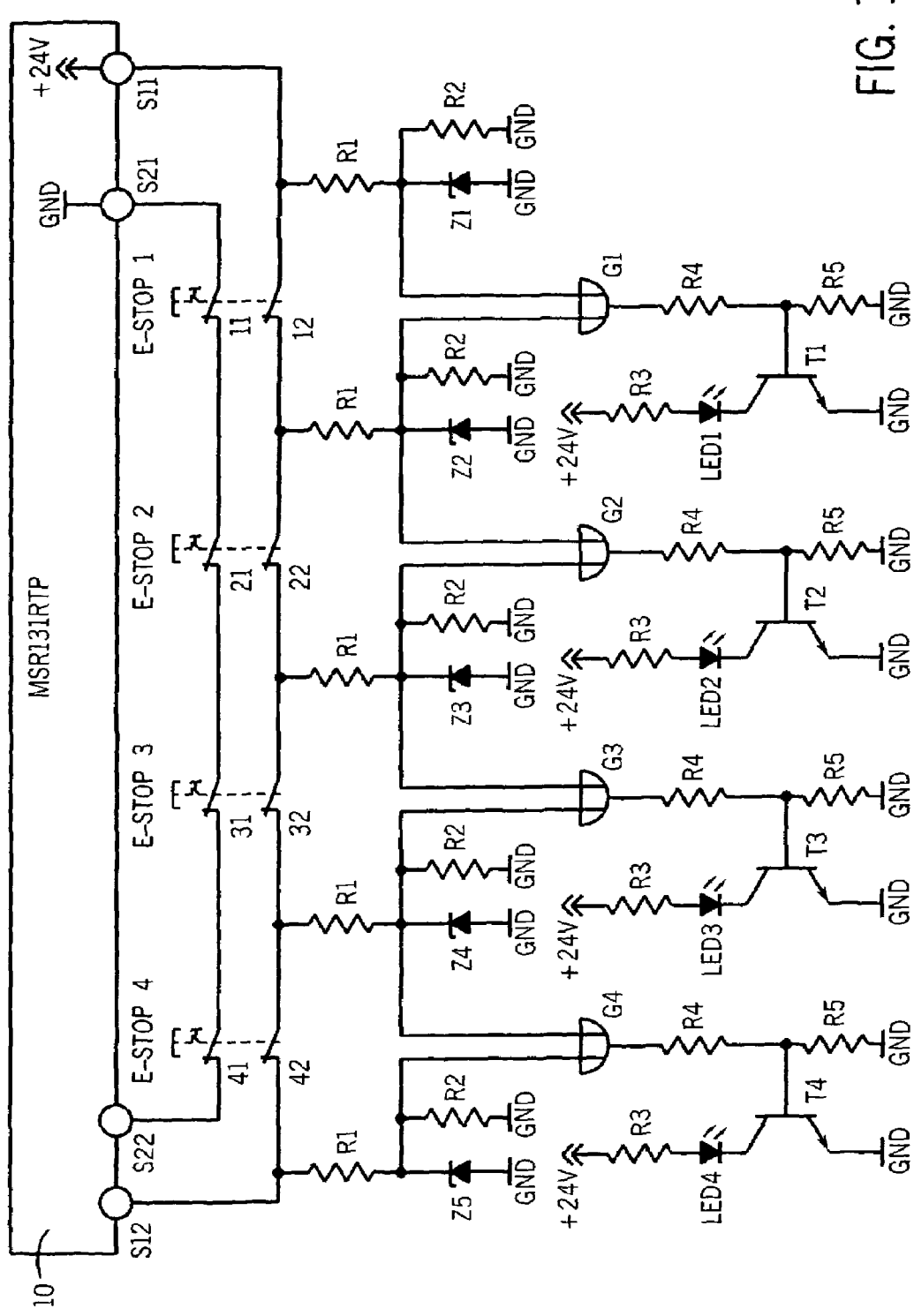
FIG. 1 is a schematic diagram of one embodiment of a circuit arrangement according to the present invention for use in a safety relay, for example, a hardwired safety relay.

Referring to FIG. 1, an outline of a conventional two-channel safety relay 10 of a type having a hard-wired logic or relay logic is shown. A safety relay of this type is, for example, model "MSR131RTP" that is commercially available from Rockwell Automation, Inc. and discussed in a publication by Rockwell Automation: "SAFETY-BR001B-EN-P", April 2002, page 56. For purposes of describing the present invention it is sufficient to refer to four external terminals S11, S12, S21, S22 of the shown safety relay 10 even though it has a large number of additional terminals.

Terminals S11 and S21 are signal outputs and terminals S12 and S22 are signal inputs of the safety relay and serve to be connected to safety devices such as emergency stop switches. In the illustrated embodiment, four emergency stop switches E-Stop 1, E-Stop 2, E-Stop 3, E-Stop 4 are connected in series between the signal output and input terminals. The connection of the switches allows conventional cross-fault detection. Each one of the emergency stop switches has two sets of normally closed contacts 11,12; 21,22; 31,32; 41,42. The contacts of each one of the emergency stop switches are mechanically linked to one another. As outlined above, such a series arrangement of switches in safety relays is called daisy chain.

Output terminal S11 is connected to +24 Volt DC and output terminal S21 is connected to ground. Accordingly, both poles of a signal voltage of 24 Volts DC are available at the signal output terminals S11 and S21.

Input terminal S12 is connected via the magnet coil of a first contactor (not shown) to ground and input terminal S22 is connected via the magnet coil of a second contactor (not shown) to +24 Volt DC. The two contactors are used to operate safety outputs (not shown) of the safety relay 10.

The above-described internal construction of the safety relay 10 is conventional and well known in the art. The same holds true for the above-described connections of the emergency stop switches to the signal input and output terminals of the safety relay. The explained connections are used to perform an asymmetric dual-channel safety function with cross-fault monitoring well known to those versed in the art.

As shown in FIG. 1, an electronic circuit arrangement according to one aspect of the invention connects the second set of normally closed contacts 12, 22, 32, 42 of the emergency stop switches. The circuit arrangement includes four voltage comparators in the form of four EXCLUSIVE OR gates G1, G2, G3, G4. Each one of the gates is associated with one of the emergency stop switches E-Stop 1, E-Stop 2, E-Stop 3, and E-Stop 4. Each gate G1, G2, G3, G4, has two inputs, one input being connected via a first resistor R1 to one side of the associated switch contact and the other input being connected via a second resistor R1 to the other side of the associated switch contact. In addition, each one of the two inputs of each one of the gates G1, G2, G3, G4 is connected to ground via a respective resistor R2 and to the cathode of a respective 5 Volt zener diode Z1-Z5, the cathode of which is also connected to ground. As some of the zener diodes are common to two adjacent gates there is only a total of five zener diodes Z1, Z2, Z3, Z4, Z5, as it can be seen in FIG. 1.

Each one of the EXCLUSIVE OR gates G1-G4 has an output which is connected to ground via a respective series circuit of two resistors R4 and R5. The connection point between the two resistors R4 and R5 is connected to the base of a respective one of four transistors T1, T2, T3, T4. Accordingly, each one of the four transistors T1-T4 is associated with one of the four EXCLUSIVE OR gates G1-G4.

The collector of each one of the four transistors T1-T4 is connected to the +24 Volt via a respective light emission diode LED1-LED4 connected in series with a respective resistor R3. There are four light emission diodes LED1, LED2, LED3, LED4 each one of which is associated with a respective one of the four EXCLUSIVE OR gates G1, G2, G3, G4 and a respective one of the contacts 12, 22, 32, 42 of the four emergency stop switches E-Stop 1, E-Stop 2, E-Stop 3, E-Stop 4.

Figure 2:
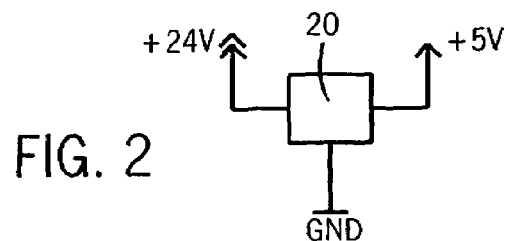
FIG. 2 is a schematic diagram of a power supply for supplying power to logical gates of the circuit arrangement shown in FIG. 1.

Referring now to FIG. 2, an internal power supply 20 of the circuit arrangement described with respect to FIG. 1 is shown. The internal power supply 20 is connected to the above-described +24 Volt and ground. It serves to supply each one of the EXCLUSIVE OR gates G1-G4 with a supply voltage of +5 Volts and may include a reverse-biased 5 Volt zener diode (last shown) in series with a current-limiting resistor (not shown).

It should be noted that the circuit arrangement of FIG. 1 and the internal power supply 20 of FIG. 2, together, are designed in such a manner that a two-pole supply voltage which is identical to the voltage being available at the signal output terminals S11 and S21 can be used. Hence, power supply for circuit arrangement of FIG. 1 can be directly derived from the two-channel supply voltage of the daisy chain, which is not only available at signal output terminals S11 and S21, but also at the first switch in the chain, as shown in FIG. 1 on the right hand side of E-Stop 1. Provided that E-Stop 1 and any preceding switches are in their closed positions, the voltage can even be derived from any point along the daisy chain. Accordingly, no additional wiring is required to power the circuit arrangement.

The illustrated and above described circuit arrangement offers the possibility to test whether or not each one of the four emergency stop switches will duly open its normally closed contacts 12, 22, 32, 42 when the respective switch E-Stop 1, E-Stop 2, E-Stop 3, E-Stop 4 is actuated.

When the +24 Volt supply voltage is present and none of the emergency stop switches E-Stop 1, E-Stop 2, E-Stop 3, E-Stop 4 are actuated, (i.e. each one of the contacts 12, 22, 32, 42 is in its closed position), a voltage of +24 Volts will be present on each side of each one of the contacts. Likewise, there will be a same voltage of +5 Volts will be present at each one of the inputs of each one of the EXCLUSIVE OR gates G1-G4, and there will be no voltage at the output of each one of these gates G1-G4. Hence, each one of the transistors T1, T2, T3, T4 will be in its non-conducting state and none of the light emitting diodes LED1, LED2, LED3, LED4 will be in an on-state.

When in the course of a test sequence one of the four emergency stop switches E-Stop 1-E-Stop 4 has been actuated, for example E-Stop 3, and the corresponding contact 32 has been duly opened, while the other contacts 12, 22, 42 remain closed, there will be 24 Volts across the open contact 32 and, accordingly, a voltage of 5 Volts between the two inputs of EXCLUSIVE OR gate G3. As a result thereof, a voltage signal will be generated at the output of gate G3 that will drive transistor T3 into a conducting state. Consequently, LED3 will be switched into an on-state and will indicate proper operation of contact 32.

When, on the other hand, contact 32 will not open, despite actuation of E-Stop 3, LED3 will not be switched into the on-state, but will remain in an off-state indicating, for example, welded contacts of E-Stop 3.

Of course, the circuit arrangement can also be used to indicate the opening of contacts of one of the emergency stop switches during normal operation.

It is self-evident that a circuit arrangement similar to that one shown in FIG. 1 can be additionally connected to or can alternatively be connected to the contacts 11, 21, 31, 41. It is also self-evident that less or more switches can be connected in daisy chain with the terminals of the safety relay.

In addition, other electronic and/or logic components and/or indicating or display means can be used to perform the explained function of the circuit arrangement. The generated indicating signal can also be supplied to any module of a safety system and can be evaluated therein.

Furthermore, other normally closed and/or normally open switches can be connected to the safety relay. Likewise, the safety relay can be operated in a one channel mode only.

In addition, the above-described invention can also be applied to safety relays that are microprocessor-based or have a programmable logic which exhibit terminals corresponding to input and output terminals S12, S22, S21 and S11.

Figure 3:
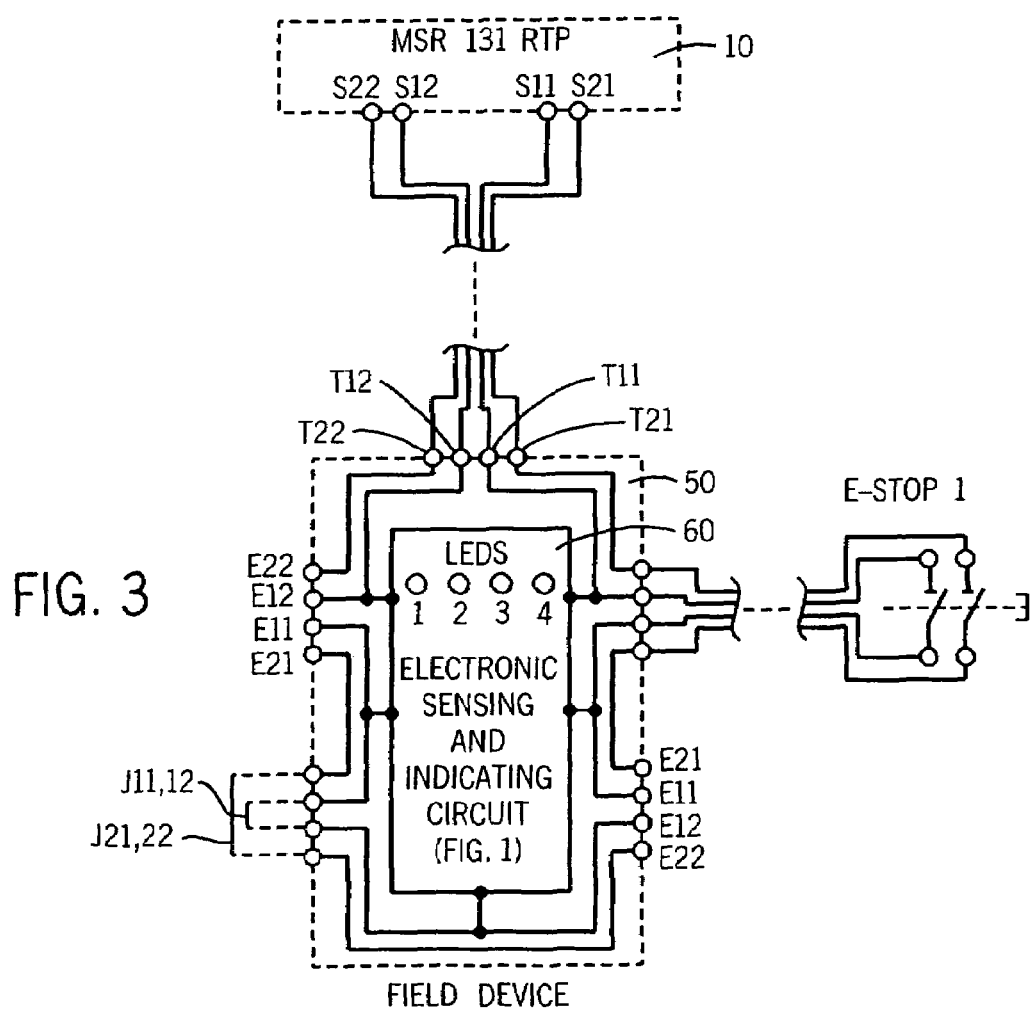
FIG. 3 is a schematic diagram of one embodiment of a field device according to the invention and its connections to a safety relay and emergency stop switches monitored by the safety relay.

Referring now to FIG. 3, a field device 50 according to the invention is shown. The field device 50 has a first plurality of external terminals T11, T12, T21, T22 for connecting the field device 50 to standard signal terminals of a safety relay such as the two-channel safety relay 10 described above. As shown, terminals T11, T12, T21, T22 are connected via a four-wire cable with the signal terminals S11, S12, S21, S22 that are normally used to apply the signal voltage to the safety devices.

In addition, the field device 50 has four second pluralities of external terminals E11, E12, E21, E22 for connecting the field device 50 to four safety devices such as emergency stop switches E-Stop 1, E-stop 2, E-Stop 3, E-Stop 4 described above. Additionally, FIG. 3 shows only E-Stop 1 and a four-wire cable connecting E-Stop 1 with a first one of said four second pluralities of external terminals E11, E12, E21, E22.

The field device 50 includes an electronic voltage sensing and indicating circuit 60 that has the same or a similar function as that of the circuit arrangement illustrated and described in connection with FIGS. 1 and 2 and that may have the same or a similar construction. In this context, it should be noted that the circuit 60, like the circuit arrangement shown in FIGS. 1 and 2, is supplied with electrical energy via the regular signal lines which are used in any case to connect the signal input and output terminals S11, S12, S21, S22 of the safety relay 10 with the emergency stop switches. In this regard, any separate or additional power supply lines are not necessary.

As shown in FIG. 3, some sections of the series or daisy chain connection between the safety relay 10 and the emergency stop switches E-Stop 1, E-Stop 2, E-Stop 3, E-Stop 4 may be provided by internal wiring within the field device 50. More specifically, terminals T11 and T21 may be internally connected with terminals E11 and E21, respectively, of the first one of the second plurality of external terminals, terminals E12 and E22 of the first one of the second plurality of external terminals are internally connected with terminals E11 and E21, respectively, of the second one of the second plurality of external terminals, terminals E12 and E22 of the second one of the second plurality of external terminals are internally connected with terminals E11 and E21, respectively, of the third one of the second plurality of external terminals, and so on, until finally, terminals E12 and E22 of the fourth one of the second plurality of terminals are internally connected with terminals T12 and T22, respectively.

In correspondence with the illustration in FIG. 1, the internal wiring within the field device 50 provides connections between the terminals E11 and E12 of each one of the second plurality of external terminals and the electronic circuit 60 in order to provide connections from both sides of a first set of contacts of the emergency switches to voltage sensing means of the electronic circuit, which is shown in FIG. 3 only in form of a block having four LEDs 1, 2, 3, 4. Of course, additional internal connections can be provided from the terminals E21 and E22 to the electronic circuit 60 within the field device in order, for example, to also sense the voltage across the second set of contacts of the emergency stop switches. In this case eight LEDs may be provided.

It should be recognized that the number of the external terminals of the field device is not limited to those indicated above. In addition, it is not required to connect each one of the second pluralities of external terminals with a safety device. In case of an absence of a safety device or a contact thereof, any non-connected terminals can be bridged by jumpers such as J11,12 and J21,22, as shown in FIG. 3.

It is self-evident for those skilled in the art that the indicating device, the circuit arrangement and the field device as well as the functions thereof can be implemented in microcontroller logic rather than with discrete components as described in the exemplary embodiments.

The invention claimed is:

1. An indicating device for indicating the status of one of a plurality of switches connected in series between input and output signal terminals of a safety relay, each switch actuable between an open position and a closed position and being actuable, the indicating device comprising:
    a sensor configured to provide a signal indicating a voltage sensed at at least one of the plurality of switches;
    an indicator configured to receive the signal from the sensor and indicate the voltage sensed at the at least one of the plurality of switches; and
    wherein opening one of the plurality of switches removes the voltage applied to the input signal terminal.

2. The indicating device of claim 1 wherein the indicating device is connected to the signal terminals of the safety relay to receive the voltage applied to the at least one of the plurality of switches.

3. The indicating device of claim 1 wherein the plurality of switches are serially connected and wherein the indicating device is connected to the serially connected switches to receive the voltage applied to the at least one of the plurality of switches.

4. The indicating device of claim 1 further comprising:
    a first plurality of terminals for connection to standard signal terminals of the safety relay;
    a second plurality of terminals for connection to at least one of the plurality of switches;
    an electronic voltage sensing and indicating circuit; and
    wherein the first plurality of terminals, the second plurality of terminals and the electronic circuit are electrically connected to one another within the indicating device and the electronic circuit is configured to be powered by a voltage provided at one of the first plurality of terminals and which is also applied to the plurality of switches.

5. The indicating device of claim 4 wherein the indicating device includes more than two of the second plurality of terminals.

6. The indicating device of claim 1 wherein the indicating device is a field device.

7. The indicating device of claim 1 wherein said indicating device is located in a distributed safety relay system.

8. A circuit arrangement for indicating the status of each of a plurality of switches connected in series between signal terminals of a safety relay, each switch being actuable between an open position and a closed position, the circuit arrangement comprising:
    voltage sensor associated with each of the plurality of switches and configured to receive a voltage applied to an associated switch and provide an output signal indicating a status of the associated switch;
    a plurality of indicators, each indicator connected to receive the output signal from an associated voltage sensor and indicate a state of the associated switch; and
    wherein opening one of the plurality of switches removes the voltage from one of the signal terminals of the safety relay and any of the plurality of safety switches in series between the one of the plurality of switches that was opened and the one of the signal terminals of the safety relay from which the voltage was removed upon opening the switch.

9. The circuit arrangement of claim 8 wherein the safety relay is a dual channel safety relay configured to provide both poles of a signal voltage at a first terminal and a second signal terminal of the safety relay and wherein the circuit arrangement is configured to receive power from the first signal terminal and the second signal terminal of the safety relay.

10. The circuit arrangement of claim 9 wherein the plurality of switches is connected in a daisy chain to the first signal terminal and second signal terminal and wherein the first signal terminal and the second signal terminal are signal output terminals of the safety relay.

11. The circuit arrangement of claim 10 wherein the operational power is provided by direct connection to at least one of the signal output terminals of the safety relay and the plurality of switches.

12. The circuit arrangement of claim 8 wherein the circuit arrangement is housed in a module configured to be connected to at least one of the plurality of switches.

13. The circuit arrangement of claim 8 wherein the at least one voltage sensor includes a voltage comparator.

14. The circuit arrangement of claim 13 wherein the at least one voltage comparator includes a logic gate.

15. The circuit arrangement of claim 14 wherein the logic gate comprises an EXCLUSIVE OR gate.

16. The circuit arrangement of claim 8 wherein the indicating means includes a plurality of light emitting diodes.

17. The circuit arrangement of claim 8 further comprising a plurality of voltage sensors, each voltage sensor being associated with one of the plurality of switches, and a plurality of indicating means, each indicating means being associated with one of the plurality of voltage sensors.

18. The circuit arrangement of claim 8 wherein the plurality of safety switches have normally closed contacts that are actuable into the open position.

19. The circuit arrangement of claims 8 wherein the circuit arrangement is configured to be incorporated into a field device.

20. A method for indicating the status of one of a plurality of switches connected in series between signal terminals of a safety relay, each switch actuable between an open position and a closed position, the method comprising steps of:
    applying a voltage present at least one of the signal terminals of the safety relay to a circuit arrangement for sensing and indicating voltage;
    actuating each one of the plurality of switches into the closed position;
    providing, at each of a plurality of indicators associated with respective ones of the plurality of switches, a first indicator signal that the respective ones of the plurality of switches is in the closed position:
    actuating one of the plurality of switches from the closed position into the open position, while retaining the remaining switches in the closed position:
    sensing whether a voltage is present across the actuated switch by means of said circuit arrangement, and
    providing a second indication signal at only the indicator associated with the actuated switch upon sensing the presence of a voltage to indicate that the actuated switch has been duly brought into the open position by the actuation.

21. The method of claim 20, wherein the plurality of switches are normally closed switches.

22. The method of claim 20, wherein providing the first indicator signal further includes deilluminating a light source and the second includes illuminating a light source.

* * * * *